(12) United States Patent
Heilper et al.

(10) Patent No.: US 9,274,918 B2
(45) Date of Patent: Mar. 1, 2016

(54) PREDICTION OF IMPACT OF WORKLOAD MIGRATION

(71) Applicant: International Business Machines Corporation, Armonk, NY (US)

(72) Inventors: Andre Heilper, Haifa (IL); Sharon Keidar-Barner, Megiddo (IL); Sergey Novikov, Tel-Aviv (IL)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 13/950,314

(22) Filed: Jul. 25, 2013

(65) Prior Publication Data

US 2015/0033239 A1 Jan. 29, 2015

(51) Int. Cl.
*G06F 9/46* (2006.01)
*G06F 11/34* (2006.01)
*G06F 9/455* (2006.01)
*G06F 9/50* (2006.01)

(52) U.S. Cl.
CPC ............ *G06F 11/34* (2013.01); *G06F 11/3409* (2013.01); *G06F 11/3414* (2013.01); *G06F 11/3428* (2013.01); *G06F 11/3447* (2013.01); *G06F 11/3457* (2013.01); *G06F 9/455* (2013.01); *G06F 9/5088* (2013.01); *G06F 11/3466* (2013.01)

(58) Field of Classification Search
None
See application file for complete search history.

(56) References Cited

U.S. PATENT DOCUMENTS

| | | | | |
|---|---|---|---|---|
| 6,067,412 | A * | 5/2000 | Blake | G06F 11/3409 714/E11.192 |
| 7,483,873 | B2 * | 1/2009 | Bhattacharjee | G06F 17/30306 |
| 7,487,058 | B2 * | 2/2009 | Gross | G06F 11/30 700/28 |
| 7,818,746 | B2 * | 10/2010 | Anderson | G06F 11/3428 702/108 |
| 7,996,204 | B2 * | 8/2011 | Oslake | G06F 11/3414 703/13 |
| 8,024,299 | B2 * | 9/2011 | Dias | G06F 17/30286 707/660 |
| 8,260,603 | B2 | 9/2012 | Cherkasova et al. | |
| 8,418,150 | B2 * | 4/2013 | Thirumalai | G06F 11/3428 711/154 |

(Continued)

OTHER PUBLICATIONS

Busari et al., "ProWGen: a synthetic workload generation tool for simulation evalutation of web proxy caches", University of Saskatchewan, Canad, Oct. 25, 2001, (Busari_2001.pdf; pp. 1-16).*

(Continued)

*Primary Examiner* — Hiren Patel
(74) *Attorney, Agent, or Firm* — Ziv Glazberg (57) ABSTRACT

A method, system and product for predicting impact of workload migration. The method comprising: obtaining a utilization pattern of a workload that is being executed on a first platform; generating a synthetic workload that is configured to have the utilization pattern when executed on the first platform; executing the synthetic workload on a second platform; and identifying a change in performance between execution of the synthetic workload on the first platform and between execution of the synthetic workload on the second platform in order to provide a prediction of an impact of migrating the workload from the first platform to the second platform.

16 Claims, 5 Drawing Sheets

(56) References Cited

U.S. PATENT DOCUMENTS

| | | | |
|---|---|---|---|
| 8,918,496 B2* | 12/2014 | Rolia | G06F 11/3414 703/2 |
| 9,110,948 B2* | 8/2015 | Clifford | G06F 17/30469 |
| 9,152,532 B2* | 10/2015 | Breternitz | G06F 11/3495 |
| 2005/0192781 A1* | 9/2005 | Deltch | G06F 11/3442 703/2 |
| 2008/0022285 A1* | 1/2008 | Cherkasova | G06F 9/505 718/104 |
| 2008/0028409 A1* | 1/2008 | Cherkasova | G06F 9/5061 718/104 |
| 2008/0189077 A1* | 8/2008 | Iijima | G06F 11/3414 702/186 |
| 2008/0270595 A1* | 10/2008 | Rolia | G06F 11/3414 709/224 |
| 2009/0037164 A1 | 2/2009 | Gaither et al. | |
| 2010/0325273 A1 | 12/2010 | Kudo | |
| 2011/0191094 A1 | 8/2011 | Quernermoen et al. | |
| 2011/0320391 A1 | 12/2011 | Chen et al. | |
| 2012/0143588 A1* | 6/2012 | Liu | G06F 11/3414 703/22 |
| 2012/0304179 A1 | 11/2012 | Devarakonda et al. | |
| 2013/0179144 A1* | 7/2013 | Lu | G06F 11/3414 703/20 |
| 2013/0304903 A1* | 11/2013 | Mick | H04L 43/0817 709/224 |
| 2014/0006358 A1* | 1/2014 | Wang | G06F 17/30289 707/687 |
| 2014/0229607 A1* | 8/2014 | Jung | H04L 43/0876 709/224 |
| 2015/0032436 A1* | 1/2015 | van de Kamp | G06F 9/455 703/13 |

OTHER PUBLICATIONS

Weigle et al., "Tmix: A Tool for generating Realistic TCP Application Workloads in ns-2", ACM Sigcomm, Jul. 2006, (Weigle_2006.pdf; pp. 1-12).*

Buyya et al., "Modeling and Simulation of Scalable Cloud Computing Environments and CloudSim Tookkit: Challenges and Opportunities", IEEE copyright 2009, (Buyya_2009.pdf; pp. 1-11).*

Livshutz Boris, "Putting critical applications in the public cloud", AppDynamics, Application Management for the Cloud Generation, Business White Paper, Jun. 2011.

Li et al., "Cloudcmp: shopping for a cloud made easy", HotClouD'10 Proceedings of the 2nd USENIX conference on Hot topics in cloud computing, 2010.

* cited by examiner

PREDICTION OF IMPACT OF WORKLOAD MIGRATION

TECHNICAL FIELD

The present disclosure relates to performance in general, and to performance prediction, in particular.

BACKGROUND

Computer workloads are executed by a platform, such as a computing machine, a server, a virtual server, a cloud-based server, or the like. The performance of a workload may be highly-affected by the configuration of the platform. In some cases, migrating the workload from one platform to another platform may drastically affect the performance, for better or for worse. As an example, the performance may be improved drastically. As another example, the performance may deteriorate even to the point in which the workload is deemed to not be handled properly (e.g., suffer from unacceptable latency, unable to process the requests due to lack of free memory, or the like).

Migration of a workload is not a trivial task. It may be hard to deploy the workload on the new system. In addition, deploying a workload on a new platform may not be desirable due to confidentiality of the data that is being processed by the workload. Consider a workload of a bank which involves the processing of highly-confidential financial transactions. Deploying the workload to a new platform, such as owned by a different vendor than the previous platform, may expose the confidential data to the new vendor and may not be desired until the bank is indeed certain that it would prefer to use the new platform. However, in order to make such decision, the bank would like to understand how the migration is expected to affect the performance of the workload.

BRIEF SUMMARY

One exemplary embodiment of the disclosed subject matter is a computer-implemented method comprising: obtaining a utilization pattern of a workload that is being executed on a first platform; generating a synthetic workload that is configured to have the utilization pattern when executed on the first platform; executing the synthetic workload on a second platform; and identifying a change in performance between execution of the synthetic workload on the first platform and between execution of the synthetic workload on the second platform in order to provide a prediction of an impact of migrating the workload from the first platform to the second platform.

Another exemplary embodiment of the disclosed subject matter is a computerized apparatus having a processor, the processor being adapted to perform the steps of: obtaining a utilization pattern of a workload that is being executed on a first platform; generating a synthetic workload that is configured to have the utilization pattern when executed on the first platform; executing the synthetic workload on a second platform; and identifying a change in performance between execution of the synthetic workload on the first platform and between execution of the synthetic workload on the second platform in order to provide a prediction of an impact of migrating the workload from the first platform to the second platform.

Yet another exemplary embodiment of the disclosed subject matter is a computer program product comprising a non-transitory computer readable medium retaining program instructions, which instructions when read by a processor, cause the processor to perform a method comprising: obtaining a utilization pattern of a workload that is being executed on a first platform; generating a synthetic workload that is configured to have the utilization pattern when executed on the first platform; executing the synthetic workload on a second platform; and identifying a change in performance between execution of the synthetic workload on the first platform and between execution of the synthetic workload on the second platform in order to provide a prediction of an impact of migrating the workload from the first platform to the second platform.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to provide a reliable prediction of an impact on performance that will be caused by a migration of a workload to another platform.

In some cases, potential customers of platform vendors are approached in order to migrate to a platform offered by the vendor. In order to convince the customer that his workload performance will not deteriorate or even to show that the workload performance improves a reliable prediction may be desired. Similar prediction may also be desired in order to choose a target platform or target configuration to which a workload should be deployed.

Another technical problem is to provide the prediction without deployment of the workload. A naïve approach to the prediction problem may be to deploy the workload on a new system and monitor its performance; however this may be an undesirable solution. The customer may not be willing to experiment with a workload at production stage, may want to avoid providing confidential information to potential vendor for security reasons, or the like. In some cases, redeploying the workload on a new system may be a significant effort which may only be cost-effective if there's a performance improvement.

Yet another technical problem is to provide said prediction based on non-confidential data related to the workload, which the customer is more prone to give access to.

One technical solution is to generate a synthetic workload having, on the original platform, the same utilization pattern as the workload itself. The synthetic workload may be migrated to a target platform in order to determine impact of such migration on performance. The determined impact may be used to predict the impact of migrating the workload itself. In some exemplary embodiments, the prediction may be obtained without the use of expert knowledge.

A synthetic workload may be a set of instructions to a platform making use of the resources of the platform. The synthetic workload may be characterized as having the same utilization pattern as the workload itself while having different functionality. As an example, the workload may be a software-based system to handle financial transactions. In order to implement is functionality, the workload may use the components of the platform, such as for example, Central Processing Unit (CPU), storage device (or other IO components), or the like. The synthetic workload, on the other hand, may utilize the same components of the original platform but may not be aimed at performing the same functionality. In some cases, the synthetic workload may not be aimed to perform any specific functionality and may instead perform operations that have no particular goal except exercising the different components of the platform in a similar utilization pattern as the workload. For example, the CPU may be exercised by performing computations, the outcome of which may be dropped. The storage device may be exercised by performing read/write operations without any particular goal to retrieve data or to store data for future use.

A utilization pattern of a workload may be viewed as an abstraction of the workload. One implementation of the abstraction is the workload itself. Alternative implementation may be a synthetic workload. An impact on performance of migrating the synthetic workload to another platform may be indicative of the impact such a migration would have on the workload itself.

In some exemplary embodiments, the utilization pattern may not define an order of execution between concurrent entities executing the workload. As an example, the utilization pattern may be indifferent to an order of execution and/or synchronization between processes or threads that are used to execute the workload. Hence, the synthetic workload may not impose the same execution order as is imposed by the original workload (e.g., using a locking mechanism or some other synchronization mechanisms).

In some exemplary embodiments, a utilization pattern of a workload may be obtained based on non-intrusive monitoring of the workload. The monitoring may be aimed at tracking, over time, utilization of different components of the platform while the workload is operational. The non-intrusive monitoring may be unaware of the actual instructions being performed, the functionality being carried out, the data being retrieved, calculated, or stored, or similar functional aspects of the workload.

In some exemplary embodiments, the synthetic workload may be implemented by a program that is configured to exercise the different components of the platform. The program may be executed on the original platform or a platform having a configuration that is considered as equivalent thereof. The program may be calibrated on such a platform to implement the utilization pattern. Once the program is calibrated, it may be migrated to the target platform for execution. During execution on the target platform performance may be compared to that in the original platform.

In some exemplary embodiments, the program may be configured to work in intervals having a predetermined duration. During each such interval the program may execute instructions until the utilization as indicated by the utilization pattern is met. During the rest of the duration, the program may be idle (e.g., sleep). Comparing the performance may be performed by comparing the idle time during each interval, cumulative idle time or the like. No idle time in one interval may be indicative of the target platform being unable to handle the workload. Reduction in average idle time over all intervals may be indicative of improvement in performance; reduction in idle time in all intervals may be indicative of improvement in performance; reduction in cumulative idle time may be indicative of improvement in overall performance though performance may deteriorate in certain intervals. In some exemplary embodiments, the worst case interval may also be used as an indication of improvement or deterioration in performance.

Another technical solution is to generate a plurality of alternative synthetic workloads implementing the utilization pattern. Each synthetic workload may be considered as a different implementation of the abstraction. Observing a plurality of different synthetic workloads may be useful in improving the prediction.

As an example, if all synthetic workloads are observed having improvement in their performance, it may be indicative that the workload is also likely to have its performance improve in response to such a migration. If most synthetic workloads achieve performance improvement while some have their performance deteriorate slightly, the prediction may be that it is likely that the migration would improve performance but in any case the target platform would be able to handle the workload. If the target platform is unable to handle some synthetic workloads determining which aspects of the workloads cause the difference in performance may be important. In some exemplary embodiments, the worst case scenario may be predicted using the synthetic workload which had the worst affect on its performance (e.g., the slightest improvement or worst deterioration).

In some exemplary embodiments, the synthetic workloads may be split into groups based on the change of performance (e.g., improvement, deterioration, partial improvement, target platform failing to handle the workload, or the like). A differentiating factor may be identified based on the similarities of the workloads in each group and the differences between each such group. The differentiating factor may be indicated to a user who may indicate how to which group the workload belongs. Additionally or alternatively, additional monitoring may be performed to determine to which group the workload belongs. Additionally or alternatively, the differentiating factor may be useful to understand which configuration is preferable in the target platform. One example of a differentiating factor may be a relative number portion of floating point calculations being performed. Such information may not be observable using non-intrusive monitoring and may be known to the user.

In some exemplary embodiments, the disclosed subject matter may be used to compare different configurations of the target platform (e.g., different target platforms) and enable recommending on a suitable configuration for the workload migration. The recommendation may be based on comparing migrations to different configurations to determine which achieves the best result, the best worst case result, best average result or the like. The configuration may also be recommended based on the differentiating factor.

Figure 1A:
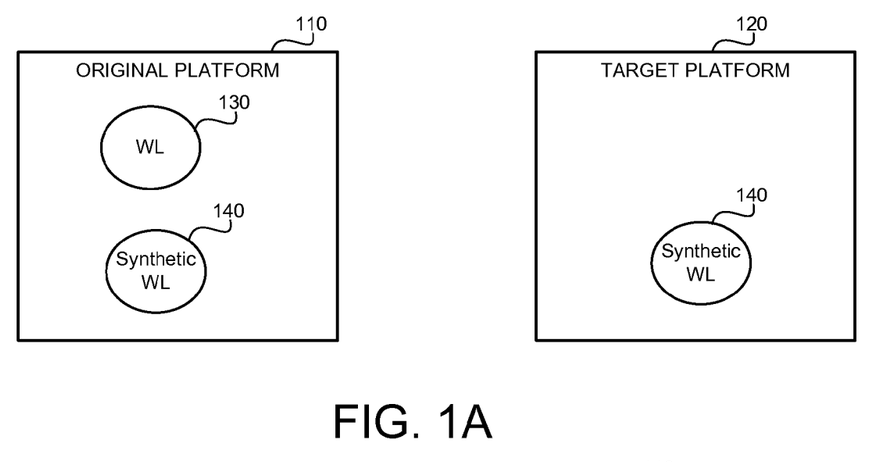
FIG. 1A-1B show illustration of computerized environment in accordance with some exemplary embodiments of the disclosed subject matter.

Reference in now made to FIG. 1A showing a computerized environment in accordance with some embodiments of the disclosed subject matter. Original Platform 110, such as a computer server, may execute a Workload (WL) 130. In order to predict an impact of migrating WL 130 to another platform, Target Platform 120, a Synthetic Workload (SWL) 140 may be generated. SWL 140 may be executed on both platforms 110 and 120 in order to identify affect on performance. In some exemplary embodiments, SWL 140 is executed on Original Platform 110 instead of WL 130. Additionally or alternatively, SWL 140 may be executed on a platform that is considered equivalent to Original Platform 110. The effect on performance may be indicative on an effect on performance that would occur should WL 130 also be migrated to Target Platform 120.

Figure 1B:
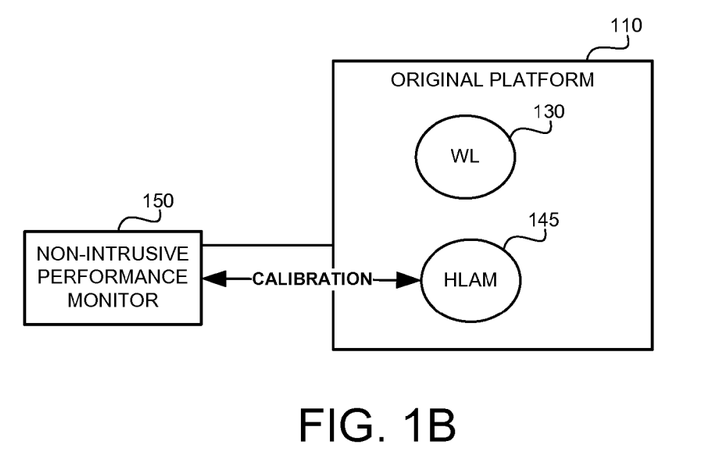

FIG. 1B, to which reference is now made, illustrates the use of a High Level Application Model (HLAM) 145 in order to generate SWL 140. A Non-Intrusive Performance Monitor 150 may be configured to monitor utilization pattern of WL 130 when executed on Original Platform 110. Once the utilization pattern is determined, HLAM 145 is configured to provide a SWL 140 having the same utilization pattern. HLAM 145 may be thought of as a concretization mechanism to determine a concretization (e.g., SWL) out of an abstraction (e.g., utilization pattern). HLAM 145 may generate instructions that exercise the different components of Original Platform 110. Such instructions may be executed and the performance may be monitored by Monitor 150 which may provide feedback to HLAM 145 in order to calibrate itself to generate instructions having the same utilization pattern as WL 130. Such a calibration operation may be performed until HLAM 145 has generated SWL 140.

It will be noted that SWL 140 as well as HLAM 145 may be executed instead of the Original Platform 110 on a third platform that is considered to be equivalent to the Original Platform 110. The third platform may emulate the Original Platform 110. Such a third platform may be used, for example, in case the Original Platform 110 is used in production.

Figure 2A:
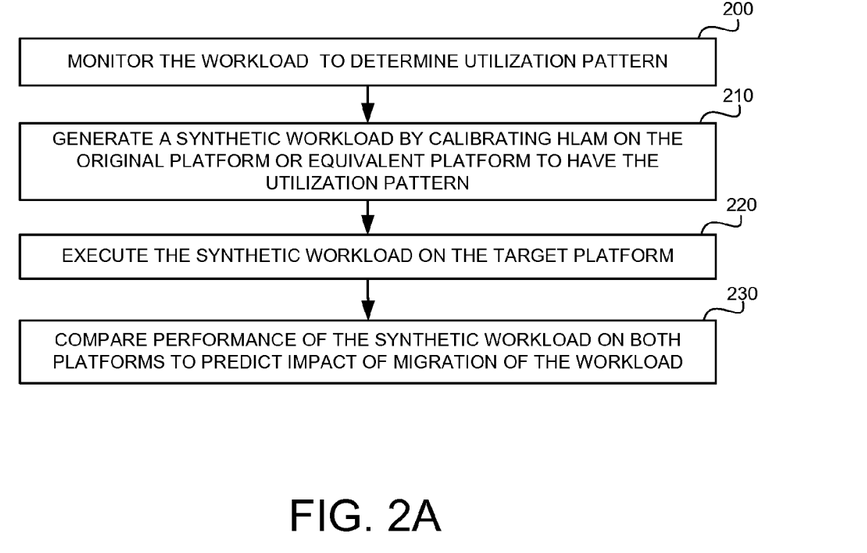
FIG. 2A shows a flowchart diagram of a method, in accordance with some exemplary embodiments of the disclosed subject matter.

Reference is now made to FIG. 2A showing a flowchart diagram of a method, in accordance with some exemplary embodiments of the disclosed subject matter.

In Step 200, the workload's performance may be monitored in order to determine a utilization pattern of the workload. The monitoring may be non-intrusive monitoring gaining access only to utilizations of the system's resources (e.g., % CPU, % IO, memory usage (real/virtual), type of memory access (direct access, sequential), or the like). In some exemplary embodiments, the utilization pattern may be obtained from another source such as may be received as an input from the user.

In Step 210, a synthetic workload may be generated by calibrating a HLAM on the original platform. The synthetic workload may have the same utilization pattern as the workload when executed by the original platform. In some exemplary embodiments, HLAM may be an executable that creates synthetic workloads that implement the specification of the synthetic workload (e.g., the utilization pattern). In some exemplary embodiments, the HLAM may be configured to load the calibrated parameters and generated the synthetic workload on the fly in accordance with the calibrated parameters. Additionally or alternatively, the HLAM may generate a separate executable program that implements the synthetic workload (e.g., a file comprising the instructions of the synthetic workload).

In Step 220, the synthetic workload is also executed on the target platform. In some exemplary embodiments, the synthetic workload may be executed by executing the calibrated HLAM on the target platform.

In Step 230, performance of the synthetic workload on both platforms may be compared. Based on the difference, a prediction of impact of the migration on the workload may be determined. The prediction may be reported to a user.

Figure 2B:
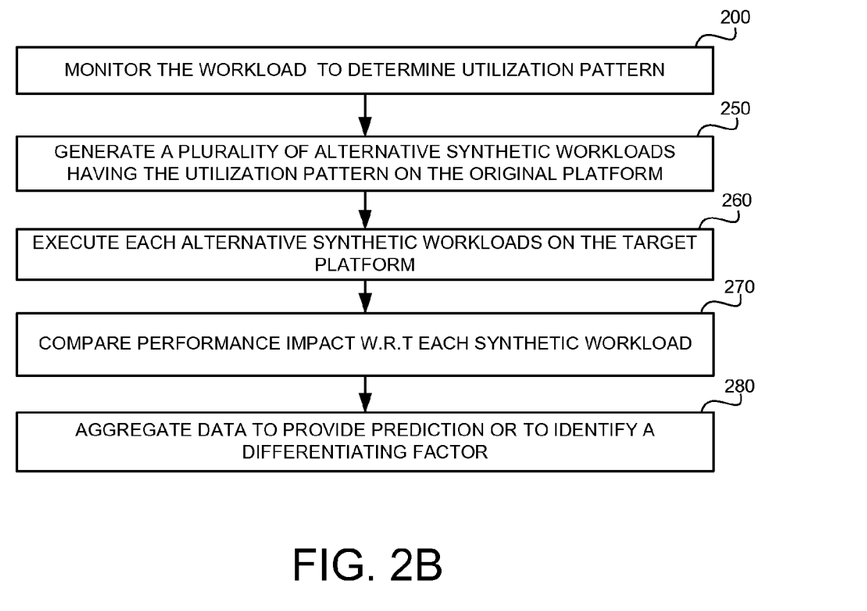
FIG. 2B shows a flowchart diagram of a method, in accordance with some exemplary embodiments of the disclosed subject matter.

Reference is now made to FIG. 2B. After the utilization pattern is determined (Step 200), a plurality of alternative synthetic workloads may be generated, each of which may be characterized as having the same utilization pattern as the workload. The plurality of alternative workloads may be generated by a HLAM. The HLAM may comprise a plurality of engines which may be used together to provide a different alternative workloads having the same utilization pattern. Each such engine may, for example, generate a load with respect to a different type of utilization parameter (e.g., % CPU, % IO, network utilization, or the like).

In steps 260-270, and similarly to steps 220-230 of FIG. 2A, each synthetic workload is executed on the target platform and its performance on the target platform is compared to that on the original platform. In Step 280, data relating to all the alternative workloads may be aggregated. The worst/best/average case scenario may be determined A prediction may be determined based on the aggregated data. Additionally or alternatively, a differentiating factor may be identified based on different groups of workloads having similar affect on performance.

Figure 3:
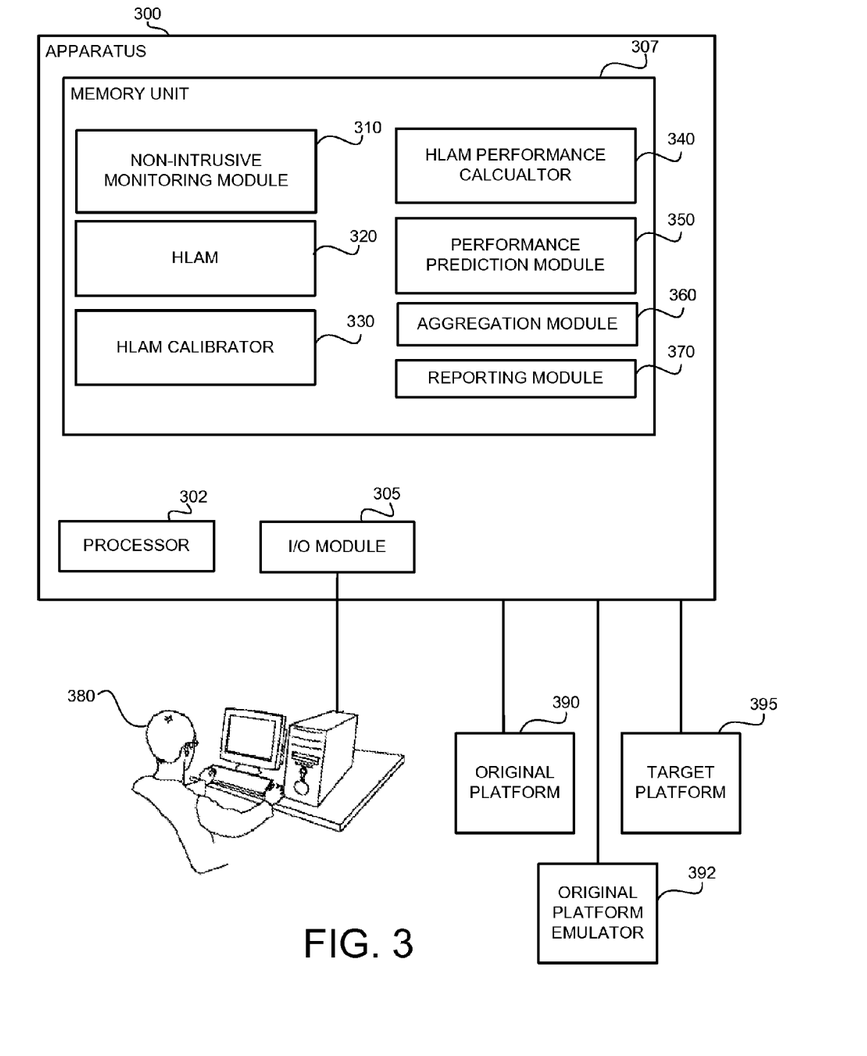
FIG. 3 shows a block diagram of an apparatus, in accordance with some exemplary embodiments of the disclosed subject matter.

Referring now to FIG. 3 showing a block diagram of components of an apparatus, in accordance with some exemplary embodiments of the disclosed subject matter. An apparatus 300 may be a computerized apparatus adapted to perform methods such as depicted in FIGS. 2A and/or 2B.

In some exemplary embodiments, Apparatus 300 may comprise a Processor 302. Processor 302 may be a Central Processing Unit (CPU), a microprocessor, an electronic circuit, an Integrated Circuit (IC) or the like. Alternatively, Apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). Processor 302 may be utilized to perform computations required by Apparatus 300 or any of it subcomponents.

In some exemplary embodiments of the disclosed subject matter, Apparatus 300 may comprise an Input/Output (I/O) Module 305 such as a terminal, a display, a keyboard, an input device or the like to interact with the system, to invoke the system and to receive results. It will however be appreciated that the system can operate without human operation.

In some exemplary embodiments, the I/O Module 305 may be utilized to provide an interface to a User 380 to interact with Apparatus 300, such as to provide the prediction to User 380, to receive indications from User 380 as to values of differentiating factors or the like.

In some exemplary embodiments, Apparatus 300 may comprise a Memory Unit 307. Memory Unit 307 may be persistent or volatile. For example, Memory Unit 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, Memory Unit 307 may retain program code operative to cause Processor 302 to perform acts associated with any of the steps shown in FIGS. 2A and/or 2B.

The components detailed below may be implemented as one or more sets of interrelated computer instructions, executed for example by Processor 302 or by another processor. The components may be arranged as one or more executable files, dynamic libraries, static libraries, methods, functions, services, or the like, programmed in any programming language and under any computing environment.

In some exemplary embodiments, some components, such as for example HLAM 320, may be executed by a different computerized system, such as Original Platform 390, Target Platform 395, or the like.

Non-Intrusive Monitoring Module 310 may be configured to monitor utilization patterns of platforms (e.g., 390) when such platforms execute workloads. In some exemplary embodiments, Monitoring Module 310 may monitor the utilization pattern in a non-intrusive manner. In some exemplary embodiments, the monitoring may be intrusive.

HLAM 320, such as HLAM 145 of FIG. 1B, may be configured to execute instructions to utilize resources of a platform. HLAM 320 may be a computer program that is loadable on a computerized platform (e.g., 390, 392, 395) and is adapted to exercise the platform's components. In some exemplary embodiments, HLAM 320 may generate synthetic workload in accordance with a utilization pattern. The synthetic workload generated by HLAM 145 may be different from one execution of HLAM 145 to another, such as it may be generated based on some random decisions.

HLAM Calibrator 330 may be configured to calibrate HLAM 320 to adhere to a specific utilization pattern. In some exemplary embodiments, HLAM 320 may be executed on Original Platform 390 or on Original Platform Emulator 392, during which time HLAM Calibrator 330 may calibrate the HLAM 320 so as to reach a desired utilization pattern. In some exemplary embodiments, calibration may be done to each engine of HLAM 320 separately. Each engine can calibrate itself to the specific platform in order to produce load which is given in platform independent manner (e.g., CPU %). The calibration parameters found by running engine with different parameters, observing the results and performing interpolation to find a correct value to the parameter.

HLAM Performance Calculator 340 may compute performance metric for an execution of HLAM 320 (optionally, a calibrated HLAM). HLAM Performance Calculator 340 may compute idle time of the HLAM during each time interval and/or aggregated idle time during execution. HLAM Performance Calculator 340 may be configured to compute a first value when the HLAM is executed on the Original Platform 390 or its emulator (392), and a second value when the HLAM is executed on Target Platform 395. Based on the difference of the values, a prediction may be provided with respect to the workload.

Performance Prediction Module 350 may provide a prediction on the impact on performance as a result of migrating the workload from Original Platform 390 to Target Platform 395. The prediction may be based on the observed change in performance from a similar migration of a synthetic workload.

Aggregation Module 360 may be configured to aggregate results relating to a number of alternative synthetic workloads, each of which implementing the same utilization pattern, in order to provide for the prediction. In some exemplary embodiments, a plurality of alternative synthetic workloads, denoted as $H_1 \ldots H_k$, may be generated having differences between them that cannot be detected in a non-intrusive manner but can potentially affect performance. The prediction of the performance of the workload may be calculated based on all performance comparisons for $H_1 \ldots H_k$. In case of mixed results, the differences between $H_1 \ldots H_k$ may be useful in pointing the user to parameters to which the migration is sensitive.

Reporting Module 370 may be configured to provide a report to User 380.

Figure 4:
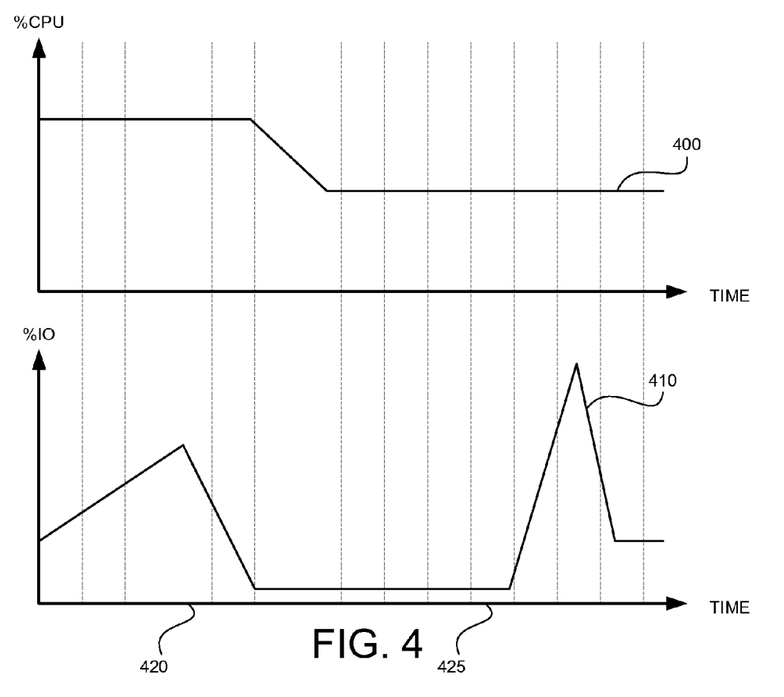
FIG. 4 shows an illustration of a utilization pattern, in accordance with some exemplary embodiments of the disclosed subject matter.

Referring now to FIG. 4 showing an illustration of a utilization pattern, in accordance with some exemplary embodiments of the disclosed subject matter. Curve 400 shows utilization of a first utilization parameter (% CPU) over time. Curve 410 shows utilization of a second utilization parameter (% I/O) over time. In some exemplary embodiments, the utilization pattern may include other or additional utilization parameters may be used. The utilization parameters may or may not be platform independent. The utilization parameters may be observable using non-intrusive monitoring of the platform.

The utilization pattern indicates a level of utilization of each utilization parameter over time. The utilization pattern may define time intervals having predetermined length, such as illustrated in FIG. 4. As an example, during Interval 420 both % CPU and % IO values are relatively high, while during Interval 425 both values are relatively low.

As can be appreciated from FIG. 4 the utilization pattern may be viewed as a scenario. The utilization load may change over time. In some exemplary embodiments, the disclosed subject matter may utilize a monitoring tool to sample utilization over time to determine the utilization pattern.

Figure 5:
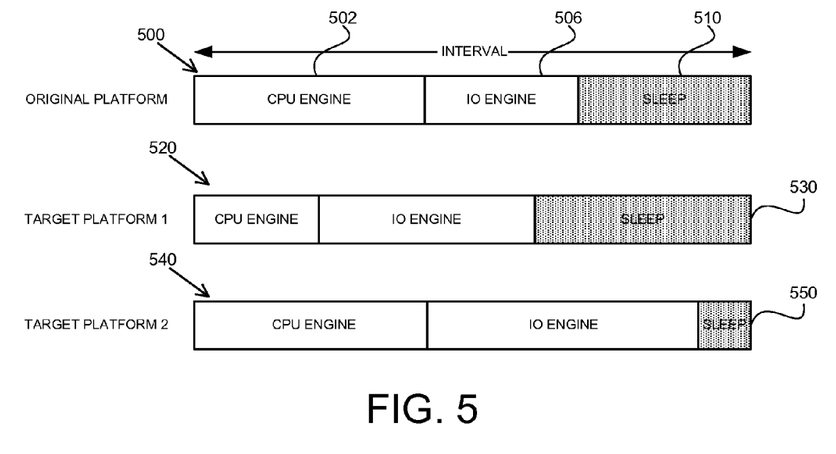
FIG. 5 shows an illustration of change in idle time of a synthetic workload, in accordance with some exemplary embodiments of the disclosed subject matter.

Reference is now made to FIG. 5 showing an illustration of change in idle time of a synthetic workload, in accordance with some exemplary embodiments of the disclosed subject matter. FIG. 5 focuses on a single interval (e.g., 420 of FIG. 4). During the interval, certain operations are performed. The operations may be performed based on a calibration of a HLAM. As an example, a CPU engine of the HLAM may be configured to utilize the CPU while an IO engine may be useful in exercising IO operations by the platform. When executed on the original platform, Block 500 shows a relative time each engine took (502, 506) until the desired utilization level was achieved. After which, the HLAM may sleep (510) until the end of the interval.

When migrating the synthetic workload to another platform, the same engines perform the same functionality (which may or may not be based on some randomization parameters). However, the time which the same engines take may change in view of the platform which exercise the workload.

Block 520 indicates execution on a first target platform. As can be appreciated idle time (Sleep 530) has increased indicating improvement in performance. As can also be appreciated the improvement is based due to improvement relating to the CPU engine. Although the performance of the IO engine deteriorates, there is an overall improvement in performance during the interval.

Block 540 indicates execution on a second platform. As can be appreciated, the idle time has significantly decreased (Sleep 550), indicating deterioration in performance due to the migration.

It will be noted that there may be different impacts on performance at different time intervals.

Figure 6:
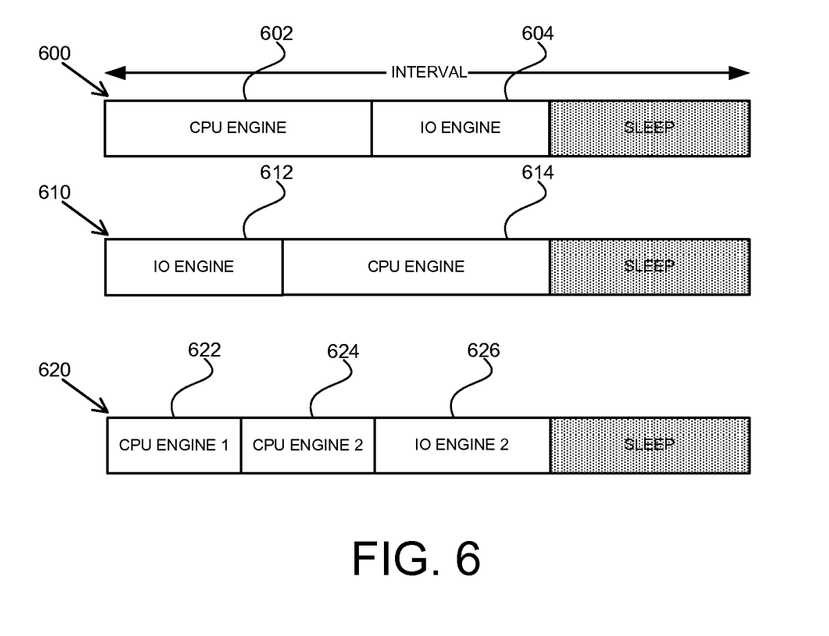
FIG. 6 shows illustrations of alternative synthetic workloads, in accordance with some exemplary embodiments of the disclosed subject matter.

Reference is now made to FIG. 6 which shows illustrations of alternative synthetic workloads, in accordance with some exemplary embodiments of the disclosed subject matter.

A first Synthetic Workload 600 is comprised by first exercising a CPU engine (Block 602) and then exercising IO engine (Block 604).

A second Synthetic Workload 610 which provides the same utilization pattern may define a different order during which first the IO engine is exercised (Block 612) and only then the CPU engine is exercised (Block 614).

In some cases, one engine may have side effect on utilization of additional utilization parameters and the engine that follows may compensate due to such side effects. For example, an IO engine may require CPU so the CPU engine may generate load that equals to the delta of CPU needed after taking into account the CPU used by the IO engine.

A third Synthetic Workload 620 which also provides the same utilization pattern may use different or additional engines to create an alternative workload. The different engine may differ in parameters that are unobservable by non-intrusive monitoring. As an example in the third Workload 620, instead of CPU engine, two different CPU engines are used (Blocks 622, 624). In addition, a different IO engine is used (Block 626).

In some exemplary embodiments, one CPU engine may differ in the type of instructions. As an example, one engine may give preference to performing floating point instructions, while another engine may give preference to performing integer instructions Impact on performance may differ in view of use of different types of instructions but may be unobservable using non-intrusive monitoring. Additionally or alternatively, one engine may give preference to performing instructions that refer to addresses that are remote from one another (e.g., not on the same memory page).

In some exemplary embodiments, the IO engines may be configured to generate a predetermined rate of IO access, such as performing writing of 10 MB during an interval. Different engine may generate different types of IO instructions, such as random access to the IO or sequential access to the IO. The IO may access, for example, a storage device which may be implemented as a hard disk on one platform and a Solid-State Drive (SSD) on another platform. In some exemplary embodiments, IO engine may generate a mixture between different types of accesses (e.g., random access write, random access read, sequential read, sequential write, etc.).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   obtaining a utilization pattern of a workload that is being executed on a first platform, the utilization pattern of the workload detailing utilization of different components of the first platform while the workload is operational;
   generating a plurality of synthetic workloads, each of which is configured to have the utilization pattern of the workload when executed on the first platform, wherein each of which performs a different set of actions than the workload, thereby providing a plurality of alternative concrete implementations of the utilization pattern of the workload;
   executing the plurality of synthetic workloads on a second platform;
   identifying changes in performance between execution of the synthetic workloads on the first platform and between execution of the synthetic workloads on the second platform in order to provide a prediction of an impact of migrating the workload from the first platform to the second platform, wherein for a first group of synthetic workloads deterioration in performance is identified, wherein for a second group of synthetic workloads improvement in performance is identified;
   indicating a differentiating factor based on the first and second groups of synthetic workloads; and
   outputting a prediction of an impact of migrating the workload from the first platform to the second platform based on the identified changes in performance between execution of the synthetic workloads on the first platform and between execution of the synthetic workloads on the second platform.

2. The computer-implemented method of claim 1, wherein said obtaining the utilization pattern of the workload comprises monitoring utilization parameters of the first platform while executing the workload.

3. The computer-implemented method of claim 1, wherein said obtaining the utilization pattern of the workload comprises monitoring in a non-intrusive manner execution of the workload by the first platform.

4. The computer-implemented method of claim 1, wherein the utilization pattern of the workload indicates utilization of one or more utilization parameters over time.

5. The computer-implemented method of claim 4, wherein the utilization parameters include at least one of the following:
   processor utilization;
   Input/Output (IO) utilization; and
   network utilization.

6. The computer-implemented method of claim 1, wherein performance of execution of at least one of the plurality of synthetic workloads on the first platform is estimated based on execution on a third platform, wherein the third platform which is considered to have a configuration that is equivalent to the first platform.

7. The computer-implemented method of claim 1, wherein at least one of the plurality of synthetic workloads is implemented by a program that is configured to utilize resources of the first platform during intervals of predetermined duration, wherein when the program is configured that in response to achieving target utilization in an interval, the program remains idle for the reminder of the interval, wherein the target utilization is defined by the utilization pattern of the workload for each interval.

8. The computer-implemented method of claim 7, wherein said generating comprises calibrating the program on the first platform or on an equivalent platform to determine one or more actions to be performed by the program during each interval to achieve the target utilization, and wherein during said executing the synthetic workloads on the second platform, the program executes the one or more actions during each interval.

9. A computerized apparatus having a processor, the processor being adapted to perform the steps of:
   obtaining a utilization pattern of a workload that is being executed on a first platform, the utilization pattern of the workload detailing utilization of different components of the first platform while the workload is operational;
   generating a plurality of synthetic workloads, each of which is configured to have the utilization pattern of the workload when executed on the first platform, wherein each of which performs a different set of actions than the workload, thereby providing a plurality of alternative concrete implementations of the utilization pattern of the workload;
   executing the plurality of synthetic workloads on a second platform;
   identifying changes in performance between execution of the synthetic workloads on the first platform and between execution of the synthetic workloads on the second platform in order to provide a prediction of an impact of migrating the workload from the first platform to the second platform, wherein for a first group of synthetic workloads deterioration in performance is identified, wherein for a second group of synthetic workloads improvement in performance is identified;

indicating a differentiating factor based on the first and second groups of synthetic workloads; and outputting a prediction of an impact of migrating the workload from the first platform to the second platform based on the identified changes in performance between execution of the synthetic workloads on the first platform and between execution of the synthetic workloads on the second platform.

10. The computerized apparatus of claim 9, wherein said obtaining the utilization pattern of the workload comprises monitoring utilization parameters of the first platform while executing the workload.

11. The computerized apparatus of claim 9, wherein said obtaining the utilization pattern of the workload comprises monitoring in a non-intrusive manner execution of the workload by the first platform.

12. The computerized apparatus of claim 9, wherein the utilization pattern of the workload indicates utilization of one or more utilization parameters over time.

13. The computerized apparatus of claim 9, wherein performance of execution of at least one of the plurality of the synthetic workloads on the first platform is estimated based on execution on a third platform, wherein the third platform which is considered to have a configuration that is equivalent to the first platform.

14. The computerized apparatus of claim 9, wherein at least one of the plurality of the synthetic workloads is implemented by a program that is configured to utilize resources of the first platform during intervals of predetermined duration, wherein when the program is configured that in response to achieving target utilization in an interval, the program remains idle for the reminder of the interval, wherein the target utilization is defined by the utilization pattern of the workload for each interval.

15. The computerized apparatus of claim 14, wherein said generating comprises calibrating the program on the first platform or on an equivalent platform to determine one or more actions to be performed by the program during each interval to achieve the target utilization, and wherein during said executing the synthetic workloads on the second platform, the program executes the one or more actions during each interval.

16. A computer program product comprising a non-transitory computer readable medium retaining program instructions, which instructions when read by a processor, cause the processor to perform a method comprising:

obtaining a utilization pattern of a workload that is being executed on a first platform, the utilization pattern of the workload detailing utilization of different components of the first platform while the workload is operational;

generating a plurality of synthetic workloads, each of which is configured to have the utilization pattern of the workload when executed on the first platform, wherein each of which performs a different set of actions than the workload, thereby providing a plurality of alternative concrete implementations of the utilization pattern of the workload;

executing the plurality of synthetic workloads on a second platform;

identifying changes in performance between execution of the synthetic workloads on the first platform and between execution of the synthetic workloads on the second platform in order to provide a prediction of an impact of migrating the workload from the first platform to the second platform, wherein for a first group of synthetic workloads deterioration in performance is identified, wherein for a second group of synthetic workloads improvement in performance is identified;

indicating a differentiating factor based on the first and second groups of synthetic workloads; and outputting a prediction of an impact of migrating the workload from the first platform to the second platform based on the identified changes in performance between execution of the synthetic workloads on the first platform and between execution of the synthetic workloads on the second platform.

* * * * *